United States Patent
Pitkethly

(10) Patent No.: US 7,405,597 B1
(45) Date of Patent: Jul. 29, 2008

(54) ADVANCED REPEATER WITH DUTY CYCLE ADJUSTMENT

(75) Inventor: Scott Pitkethly, Redwood City, CA (US)

(73) Assignee: TRANSMETA Corporation, Santa Clara, CA (US)

(*) Notice: Subject to any disclaimer, the term of this patent is extended or adjusted under 35 U.S.C. 154(b) by 0 days.

(21) Appl. No.: 11/172,013

(22) Filed: Jun. 30, 2005

Related U.S. Application Data

(63) Continuation-in-part of application No. 11/171,845, filed on Jun. 30, 2005.

(51) Int. Cl.
*H03K 3/017* (2006.01)
*H03K 19/094* (2006.01)

(52) U.S. Cl. ............................. 326/86; 326/83; 327/175

(58) Field of Classification Search .................. 326/23, 326/27, 83, 86, 121; 327/108, 112, 175
See application file for complete search history.

(56) References Cited

U.S. PATENT DOCUMENTS

| | | |
|---|---|---|
| 4,498,021 A | 2/1985 | Uya |
| 5,166,555 A | 11/1992 | Kano |
| 5,414,312 A | 5/1995 | Wong |
| 5,455,521 A | 10/1995 | Dobbelaere |
| 5,497,105 A | 3/1996 | Oh et al. |
| 5,698,994 A | 12/1997 | Tsuji |
| 5,767,700 A | 6/1998 | Lee |
| 5,791,715 A | 8/1998 | Nebel |
| 5,969,543 A | 10/1999 | Erickson et al. |
| 6,025,738 A | 2/2000 | Masleid |
| 6,114,840 A | 9/2000 | Farrell et al. |
| 6,172,545 B1 | 1/2001 | Ishii |
| 6,262,601 B1 | 7/2001 | Choe et al. |
| 6,281,706 B1 * | 8/2001 | Wert et al. ..................... 326/83 |
| 6,321,282 B1 | 11/2001 | Horowitz et al. |
| 6,573,777 B2 | 6/2003 | Saint-Laurent et al. |
| 6,577,176 B1 | 6/2003 | Masleid et al. |
| 6,731,140 B2 | 5/2004 | Masleid et al. |
| 6,768,363 B2 * | 7/2004 | Yoo et al. .................... 327/170 |
| 7,239,170 B2 * | 7/2007 | Suen et al. ..................... 326/30 |
| 2001/0000426 A1 | 4/2001 | Sung et al. |
| 2001/0030561 A1 | 10/2001 | Asano et al. |
| 2002/0056016 A1 | 5/2002 | Horowitz et al. |
| 2003/0057775 A1 | 3/2003 | Yamashita et al. |
| 2003/0160630 A1 | 8/2003 | Earle |
| 2003/0231713 A1 | 12/2003 | Masleid et al. |

FOREIGN PATENT DOCUMENTS

| | | |
|---|---|---|
| JP | 03089624 | 4/1991 |

OTHER PUBLICATIONS

Rhyne, "Fundamentals of Digital Systems Design", N.J. 1973, pp. 70-71.*

(Continued)

*Primary Examiner*—Daniel D Chang

(57) ABSTRACT

An advanced repeater with duty cycle adjustment. In accordance with a first embodiment of the present invention, an advanced repeater includes an output stage for driving an output signal line responsive to an input signal and a plurality of active devices for selectably adjusting a duty cycle of the signal. The advanced repeater may further include circuitry for producing a delayed version of the signal.

20 Claims, 2 Drawing Sheets

OTHER PUBLICATIONS

Iima et al., Capacitance Coupling Immune, Transient Sensitive Accelerator for Resistive Interconnect Signals of Subquarter Micron ULSO, IEEE Journal of Solid-State Circuits, vol. 31, No. 4, Apr. 1996.

Nalamalpu et al., "Boosters for Driving Long Onchip Interconnects-Design Issues, Interconnect Synthesis, and Comparison with Repeaters", IEEE Transactions on Computer-Aided Design of Integrated Circuits and Systems, vol. 21, No. 1, Jan. 2002.

* cited by examiner

ADVANCED REPEATER WITH DUTY CYCLE ADJUSTMENT

RELATED APPLICATIONS

This Application is a Continuation-in-Part of co-pending, commonly owned U.S. patent application Ser. No. 11/171, 845, filed Jun. 30, 2005, entitled "Advanced Repeater Utilizing Signal Distribution Delay" to Pitkethly and Masleid, which is hereby incorporated herein by reference in its entirety.

Co-pending, commonly owned U.S. patent application Ser. No. 10/864,271, filed Jun. 8, 2004, entitled "Stacked Inverter Delay Chain" to Masleid and Burr, is hereby incorporated herein by reference in its entirety.

Co-pending, commonly owned U.S. patent application Ser. No. 10/879,807, filed Jun. 28, 2004, entitled "Circuits and Methods for Detecting and Assisting Wire Transitions" to Masleid and Kowalczyk, is hereby incorporated herein by reference in its entirety.

BACKGROUND OF THE INVENTION

1. Field of the Invention

Embodiments of the present invention relate to advanced repeaters.

2. Related Art

A vital area of circuit performance is the propagation time of signals, for example synchronization or "clock" signals, across an integrated circuit. Longer wires in integrated circuits resist the propagation of signals due to the resistance and capacitance of the wire. The propagation of signals across a chip can be improved by inserting an amplification circuit, sometimes referred to as buffering or repeater insertion, into the wire.

SUMMARY OF THE INVENTION

Accordingly, a repeater circuit would be advantageous. Embodiments in accordance with the present invention provide an advanced repeater utilizing signal distribution delay.

An advanced repeater with duty cycle adjustment is disclosed. In accordance with a first embodiment of the present invention, an advanced repeater includes an output stage for driving an output signal line responsive to an input signal and a plurality of active devices for selectably adjusting a duty cycle of the signal. The advanced repeater may further include circuitry for producing a delayed version of the signal.

In accordance with another embodiment of the present invention, a method of assisting transitions of an input signal includes receiving a transition of the input signal at a circuit input and receiving a plurality of control signals to selectively adjust the duty cycle of an output signal generally corresponding to the input signal. The method further includes selectively adjusting the duty cycle, driving an output level corresponding to the transition and ceasing the driving prior to an arrival at the circuit input of a subsequent transition of the signal.

BRIEF DESCRIPTION OF THE DRAWINGS

The accompanying drawings, which are incorporated in and form a part of this specification, illustrate embodiments of the present invention and, together with the description, serve to explain the principles of the invention. The drawings referred to in this description should not be understood as being drawn to scale except if specifically noted.

DETAILED DESCRIPTION OF THE INVENTION

Figure 1:
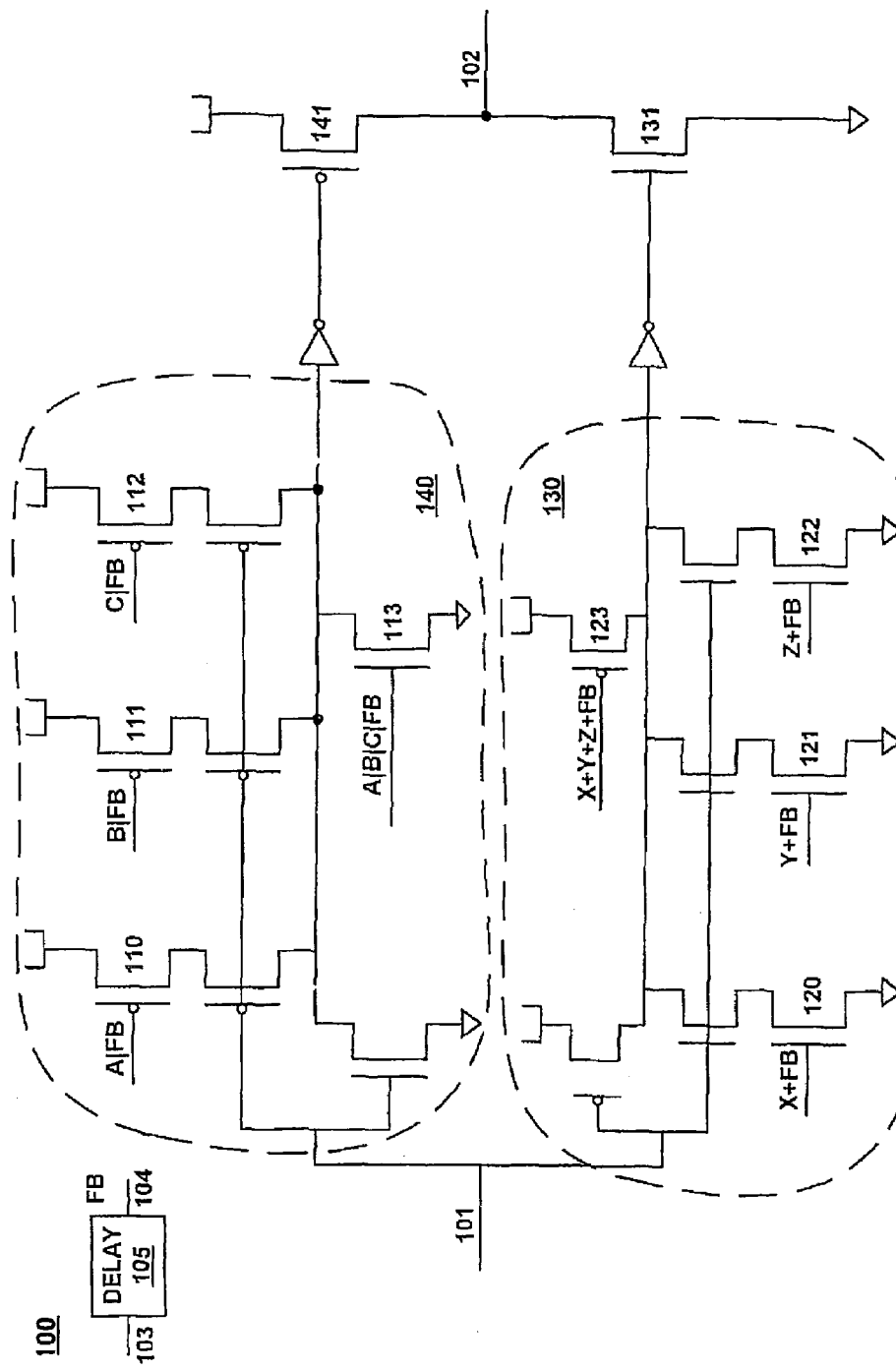
FIG. 1 illustrates a schematic of one embodiment of a circuit for driving signals on a wire and for assisting signal transitions, in accordance with embodiments of the present invention.

Reference will now be made in detail to the various embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail as not to unnecessarily obscure aspects of the present invention.

During the layout of an integrated circuit chip design, repeater circuits are inserted at periodic intervals along long metal wires in order to amplify signals (or remove distortion) as well as to reduce propagation delay (or maintain fast transition times). Synchronization timing or "clock" signal distribution networks, e.g., "clock trees," frequently utilize such repeaters. Typically, there is a wide selection of repeater circuits available to the integrated circuit designer.

Conventional, or "classic" repeater circuits generally comprise relatively simple amplifier circuits. An amplifier circuit receives a transition and actively drives its output to the new voltage state. A problem with such conventional repeaters is that, after helping achieve one transition, such circuits continue to drive the wire and thus resist the next transition.

A second general classification of a repeater circuit design is known as or referred to as an "advanced" repeater. An advanced repeater circuit generally utilizes a delayed version of the input signal in order to limit the duration that the output portion of the advanced repeater fully drives the output line. By limiting the "full drive" duration, the advanced repeater may enhance the propagation of a signal without resisting subsequent transitions.

Distortions of a clock signal duty cycle, e.g., non-symmetry of "high" periods in comparison to "low" periods, and/or asymmetric rise time versus fall time, are a deleterious characteristic of many clock distribution schemes. For example, the duty cycle of a clock signal delivered to one portion of an integrated circuit, e.g., a microprocessor, is frequently different than the duty cycle of the nominally same clock signal delivered to another portion of the integrated circuit. Such differences are generally undesirable, for example, leading to circuit timing difficulties and potential logical failures of an integrated circuit.

Unfortunately, it is generally difficult to accurately predict such clock signal discrepancies during a design stage of an integrated circuit due to limitations of circuit modeling. Additionally, the addition of circuitry to compensate for such clock signal distribution variations generally contributes additional insertion delay into the signal path, deleteriously decreasing maximum achievable clock rates. Furthermore, additional circuitry to gate a clock signal, e.g., to turn a clock signal off for power conservation purposes, generally also contributes yet another additional insertion delay into the signal path, further decreasing maximum achievable clock rates.

FIG. 1 illustrates a schematic of one embodiment of a circuit 100 for driving signals on a wire and for assisting signal transitions, in accordance with embodiments of the present invention. Circuit 100 can be coupled to a signal wire to function as a wire repeater or accelerator. As will be seen, circuit 100 provides the capability to detect a transition (e.g., a rising transition or falling transition) occurring on the wire and assist the transition, and then drive the wire after the transition without resisting a subsequent transition.

In the embodiment of FIG. 1, circuit 100 has an input node 101 and an output node 102 that are each coupled to the wire. Output node 102 can be driven high by output pull-up device 141 and driven low by output pull-down device 131. The vertical bar symbol ("|") is used to denote a logical OR function, while the addition symbol ("+") is used to denote a logical AND function.

The signal FB 104 is a delayed version of the input and/or output of circuit 100. In accordance with embodiments of the present invention, delay input signal 103 can be coupled to input 101. Delay 105 can comprise a well-known delay circuit, for example a string of inverters.

In accordance with alternative embodiments of the present invention, delay input signal 103 can be coupled to output 102. In accordance with still other embodiments of the present invention, delay 105 can be achieved though transmission line effects of a signal distribution network, as explained in more detail in co-pending, commonly owned U.S. patent application Ser. No. 11/171,845, filed Jun. 30, 2005, entitled "Advanced Repeater Utilizing Signal Distribution Delay" to Pitkethly and Masleid, which is incorporated herein by reference in its entirety.

It is to be appreciated that delay 105 should be sufficient for each drive transistor, e.g., output pull-up transistor 141 or output pull-down transistor 131 (or set of drive transistors), to be able to drive the output network, represented by output node 102, to a desirable level. For example, if the delay is too short, the output network may not achieve a level consistent with the technology's defined levels. Similarly, if the delay is too long, the maximum achievable frequency of operation of circuit 100 is undesirably reduced.

Circuit 100 comprises pull-up path 140 and pull-down path 130. Pull-up path 140 comprises a series of pull-up devices 110, 111 and 112 that can be utilized to adjust the timing of a rising edge of output 102. In accordance with embodiments of the present invention, these devices can be of different sizes and/or drive capacities, such that, when used in combination, a plurality of adjustments can be made to the timing of rising edge transitions on output 102. For example, if device 112 is twice as strong as device 111 which is twice as strong as device 110, then eight different adjustment levels could be available from the three devices. Device 113, in conjunction with devices 110, 111 and 112, enables gating off a rising edge, e.g., forcing a low output on output 102.

Pull-down path 130 comprises a series of pull-down devices 120, 121 and 122 that can be utilized to adjust the timing of a falling edge of output 102. In a manner similar to that of devices 110, 111 and 112, devices 120, 121 and 122 can be of different sizes and/or drive capacities, such that, when used in combination, a plurality of adjustments can be made to the timing of falling edge transitions on output 102.

Device 123, in conjunction with devices 120, 121 and 122, enables gating off a falling edge, e.g., forcing a high output on output 102.

A plurality of control inputs, exemplified by control signals A, B and C in FIG. 1, is provided to control the timing of the pull-up path through circuit 100. Similarly, a plurality of control inputs, exemplified by control signals X, Y and Z in FIG. 1, is provided to control the timing of the pull-down path through circuit 100.

In the embodiment of FIG. 1, the logical combination of control signal A OR FB 104 controls device 110. Similarly, the logical combination of control signal B OR FB 104 controls device 111. Likewise, the logical combination of control signal C OR FB 104 controls device 112. The logical combination of A OR B OR C or FB 104 controls device 113.

In a complementary manner, the logical combination of control signal X AND FB 104 controls device 120. Similarly, the logical combination of control signal Y AND FB 104 controls device 121. Likewise, the logical combination of control signal Z AND FB 104 controls device 122. The logical combination of X AND Y AND Z AND FB 104 controls device 123.

Table 1, below, illustrates the duty-cycle adjustments enabled by circuit 100, in accordance with embodiments of the present invention.

TABLE 1

| To perform no adjustments to signal: | |
|---|---|
| A = 0 | BC = 00 |
| X = 1 | YZ = 11 |
| To delay rising edges: | |
| A = 0 | BC = 01, 10 or 11 |
| X = 1 | YZ = 11 |
| To eliminate rising edges (force signal low) | |
| A = 1 | BC = 11 |
| V = 1 | YZ = 11 |
| To delay falling edges | |
| A = 0 | BC = 00 |
| X = 1 | YZ = 10, 01 or 00 |
| To eliminate falling edges (force signal high) | |
| A = 0 | BC = 00 |
| X = 0 | YZ = 00 |

It is appreciated that the embodiment of FIG. 1 illustrates three pull up devices (110, 111, 112) and three pull down devices (120, 121, 122). In accordance with embodiments of the present invention, greater or fewer pull up and/or pull down devices may be utilized to achieve greater or lesser rise/fall time control.

It is to be appreciated that output node 102 will tend to remain in its previous state, e.g., low, even when not actively driven, e.g., when both output drivers 131, 141 have been turned off. In accordance with alternative embodiments of the present invention, relatively weak "keeper" or "hold" circuitry may be utilized to hold output node 102 in a steady state.

For example, such keeper circuitry may operate at a reduced drive strength relative to the rising and falling transition circuitry. The keeper circuitry maintains the state at the output node 102 in between operation of the output drivers. That is, the keeper circuitry maintains a high state at output node 102 after output pull-up transistor 141 is turned off (and before output pull-down transistor 131 is turned on), and also maintains a low state at output node 102 after output pull-down transistor 131 is turned off (and before output pull-up 141 transistor is turned on).

Co-pending, commonly owned U.S. patent application Ser. No. 10/879,807, filed Jun. 28, 2004, entitled "Circuits and Methods for Detecting and Assisting Wire Transitions" to Masleid and Kowalczyk, incorporated herein by reference in its entirety, illustrates exemplary circuits and methods of such "keeper" circuitry suitable for inclusion with embodiments of the present invention.

Advantageously, embodiments of the present invention generally do not contribute additional deleterious delay to the operation of an advanced repeater. For example, when A=B=C=0 and X=Y=Z=1, the propagation delay from data input 101 to output 102 can be considered to be that of a conventional advanced repeater. In addition, adjustments to pull-up path 140 do not affect pull-down path 130, thereby allowing a shift of rising output edges without affecting falling edges. The converse is also true, as adjustments to pull-down path 130 do not affect pull-up path 140. Furthermore, independent adjustment of high time and/or low time is provided by embodiments in accordance with the present invention.

Figure 2:
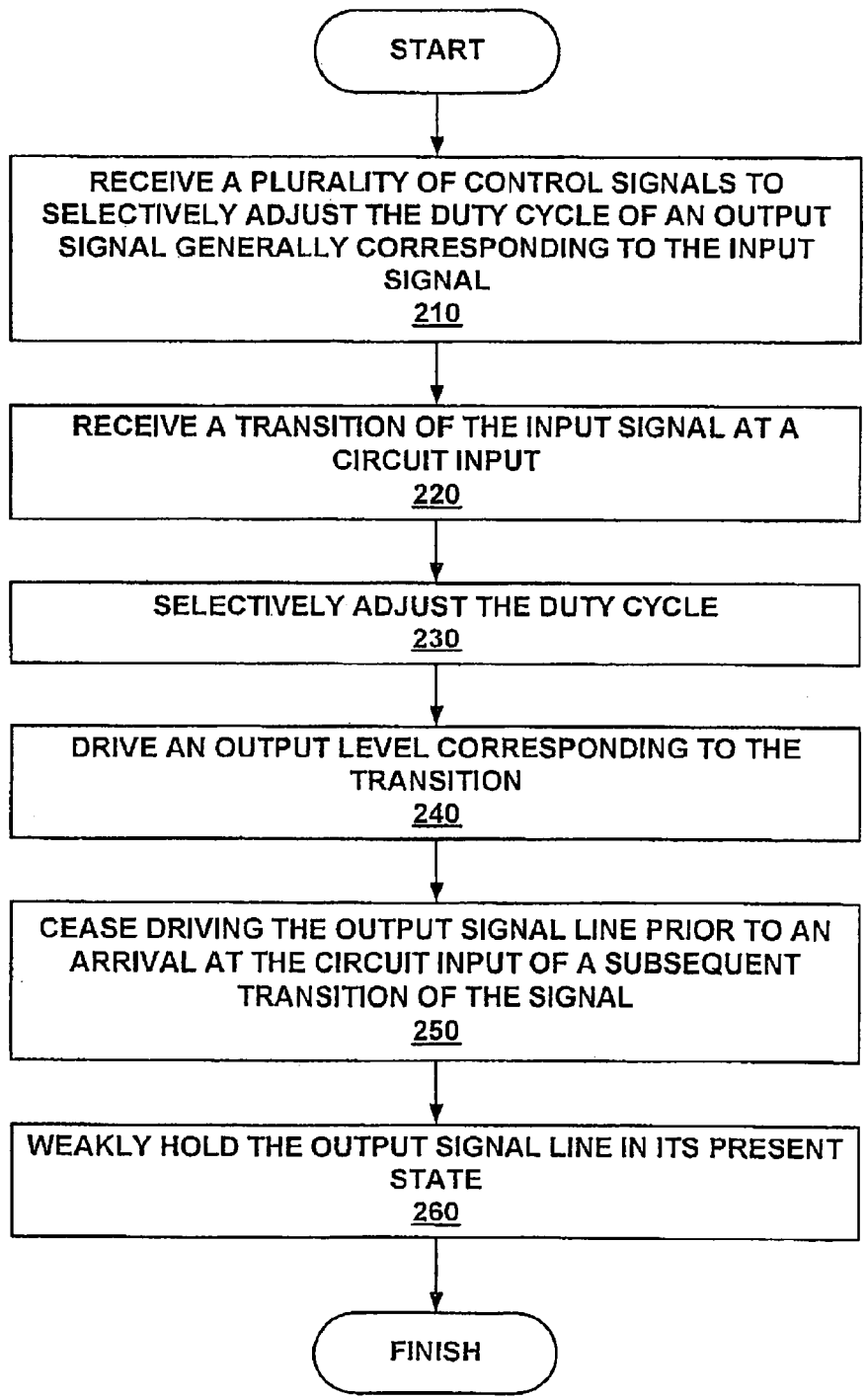
FIG. 2 illustrates a method for assisting signal transitions, in accordance with embodiments of the present invention.

FIG. 2 illustrates a method 200 for assisting signal transitions, in accordance with embodiments of the present invention. In 210, a plurality of control signals is received to selectively adjust the duty cycle of an output signal generally corresponding to the input signal. For example, control signals X, Y and Z are received at devices 120, 121 and 122 in FIG. 1.

In 220, a first input transition is received at a circuit input. For example, a low to high transition is received at input node 101 as shown in FIG. 1.

In 230, the duty cycle is selectively adjusted. For example, the control signals selectively turn on some or all of devices 120, 121 and 122 in FIG. 1, altering the pull down current in pull-down path 130 and consequently adjusting the fall time of the series of output transitions.

It is to be appreciated that increasing the transition time of a signal propagating through the pull-up path decreases the time that the output signal is at a high level. Similarly, increasing the transition time of a signal propagating through the pull-down path decreases the time that the output signal is at a low level. Consequently, such adjustments, alone or in combination, will generally affect the duty cycle of an output signal relative to the duty cycle of the corresponding input signal.

In 240, an output level corresponding to the output transition is driven at a circuit output. In 250, the circuit output ceases to be driven prior to an arrival of subsequent transition of the signal.

It is appreciated that other circuitry may hold the output signal line in its present state subsequent to the cessation of driving, in accordance with alternative embodiments of the present invention. In optional 260, the output signal line is weakly held in its present state subsequent to the cessation of driving in 250.

In summary, embodiments of the present invention provide circuits (e.g., wire accelerators and repeaters), and methods thereof, for assisting signal transitions on a wire (such as a wire on an integrated circuit). Circuit embodiments in accordance with the present invention can both drive a signal on the wire and assist during wire transitions, without resisting the transitions. Advantageously, embodiments in accordance with the present invention enable independent adjustment of the timing of rising and/or falling transitions of an output or repeated signal, without deleteriously increasing propagation delay of such repeaters.

Embodiments in accordance with the present invention are thus described. While the present invention has been described in particular embodiments, it should be appreciated that the present invention should not be construed as limited by such embodiments, but rather construed according to the below claims.

What is claimed is:

1. A circuit for assisting transitions of a signal on a wire, said circuit comprising:
    an output stage for driving an output signal line responsive to an input signal;
    a plurality of active devices for selectably adjusting a duty cycle of said signal on said wire, wherein a drive level of said output stage remains constant responsive to said adjusting;
    and
    circuitry for producing a delayed version of said signal, characterized by a delay that is greater than a transition time of said output stage less a delay of said plurality of active devices.

2. The circuit of claim 1 wherein said output signal line is inverted relative to said input signal.

3. The circuit of claim 1 wherein said circuitry for producing a delayed version of said signal comprises no discrete components.

4. The circuit of claim 1 wherein said delayed version of said signal is for changing a drive level of said output signal line.

5. The circuit of claim 4 wherein a first state of said output stage comprises a high level drive and a second state of said output stage comprises a substantially weaker level drive.

6. The circuit of claim 5 wherein said second state of said output stage comprises a keeper mode.

7. The circuit of claim 5 wherein said substantially weaker level drive comprises substantially no drive.

8. The circuit of claim 1 wherein said input signal is a microprocessor clock.

9. The circuit of claim 1 wherein said signal propagates through a maximum of three sequential devices.

10. A method of assisting transitions of an input signal, said method comprising:
    receiving a transition of said input signal at a circuit input;
    receiving a plurality of control signals to selectively adjust the duty cycle of an output signal generally corresponding to said input signal;
    selectively adjusting said duty cycle;
    driving an output level corresponding to said transition; and
    ceasing said driving prior to an arrival at said circuit input of a subsequent transition of said input signal.

11. The method of claim 10 further comprising weakly holding said output signal line in its present state subsequent to said ceasing.

12. The method of claim 10 wherein a duration of said driving is sufficient for driving said output signal line to a desired level.

13. The method of claim 10 wherein said output signal line is inverted relative to said circuit input.

14. The method of claim 10 wherein said ceasing comprises a change in state of combinatorial logic.

15. The method of claim 10 embodied in an integrated circuit.

16. The method of claim 15 embodied in a microprocessor.

17. A circuit for assisting signal transitions on a wire, said circuit comprising:
- a first transistor for driving a rising edge transition on an output signal line;
- a second transistor for driving a falling edge transition on said output signal line;
  - an OR gate having first and second inputs for controlling said first transistor;
- said OR gate further comprising a plurality of pull up transistors for selectably adjusting timing of said rising edge transition, wherein a drive level of said output signal line remains constant responsive to adjustments to said timing of said rising edge transition;
- an AND gate having first and second inputs for controlling said second transistor; and
- said AND gate further comprising a plurality of pull down transistors for selectably adjusting timing of said falling edge transition, wherein a drive level of said output signal line remains constant responsive to adjustments to said timing of said falling edge transition.

18. The circuit of claim 17 wherein said OR gate comprises a NOR gate and an inverter.

19. The circuit of claim 17 wherein said AND gate comprises a NAND gate and an inverter.

20. The circuit of claim 17 embodied in a microprocessor.

* * * * *